United States Patent
Miller et al.

(10) Patent No.: US 7,609,080 B2
(45) Date of Patent: Oct. 27, 2009

(54) VOLTAGE FAULT DETECTION AND PROTECTION

(75) Inventors: Charles A. Miller, Fremont, CA (US); Bruce J. Barbara, Discovery Bay, CA (US)

(73) Assignee: FormFactor, Inc., Livermore, CA (US)

( * ) Notice: Subject to any disclaimer, the term of this patent is extended or adjusted under 35 U.S.C. 154(b) by 151 days.

(21) Appl. No.: 11/306,186

(22) Filed: Dec. 19, 2005

(65) Prior Publication Data

US 2006/0217906 A1    Sep. 28, 2006

Related U.S. Application Data

(60) Provisional application No. 60/594,248, filed on Mar. 22, 2005.

(51) Int. Cl.
*G01R 31/26* (2006.01)
(52) U.S. Cl. .................. 324/765; 324/754
(58) Field of Classification Search ......... 324/754–765, 324/72.5
See application file for complete search history.

(56) References Cited

U.S. PATENT DOCUMENTS

| | | | |
|---|---|---|---|
| 5,996,102 A * | 11/1999 | Haulin | 714/740 |
| 6,320,390 B1 * | 11/2001 | Belforte et al. | 324/511 |
| 6,483,681 B1 * | 11/2002 | Bauer | 361/45 |
| 6,897,666 B2 * | 5/2005 | Swettlen et al. | 324/754 |
| 6,977,493 B2 * | 12/2005 | Novak et al. | 324/72.5 |
| 7,005,863 B2 * | 2/2006 | Gudmundsson et al. | 324/549 |
| 7,071,721 B2 * | 7/2006 | Furukawa | 324/765 |
| 2006/0273809 A1 * | 12/2006 | Miller et al. | 324/754 |

OTHER PUBLICATIONS

Int'l Preliminary Report on Patentability, PCT application PCT/US2006/009575 (Mar. 3, 2009), 8 pages.

* cited by examiner

*Primary Examiner*—Ha Tran T Nguyen
*Assistant Examiner*—Arleen M Vazquez
(74) *Attorney, Agent, or Firm*—N. Kenneth Burraston

(57) ABSTRACT

A fault detection and protection circuit can include a comparing circuit (e.g., a comparator or a detector) that can be connected to a power line supplying power to an electronic device being tested. The comparing circuit can be configured to detect a fault in which the power line is shorted to ground. For example, the electronic device being tested may have a fault in which its power terminals are shorted to ground. Upon detection of such a fault, the comparing circuit activates one or more switches that shunt capacitors or other energy storage devices on the power line to ground. The comparing circuit may alternatively or in addition activate one or more switches that disconnect the power supply supplying power to the electronic device under test from probes contacting the electronic device.

16 Claims, 8 Drawing Sheets

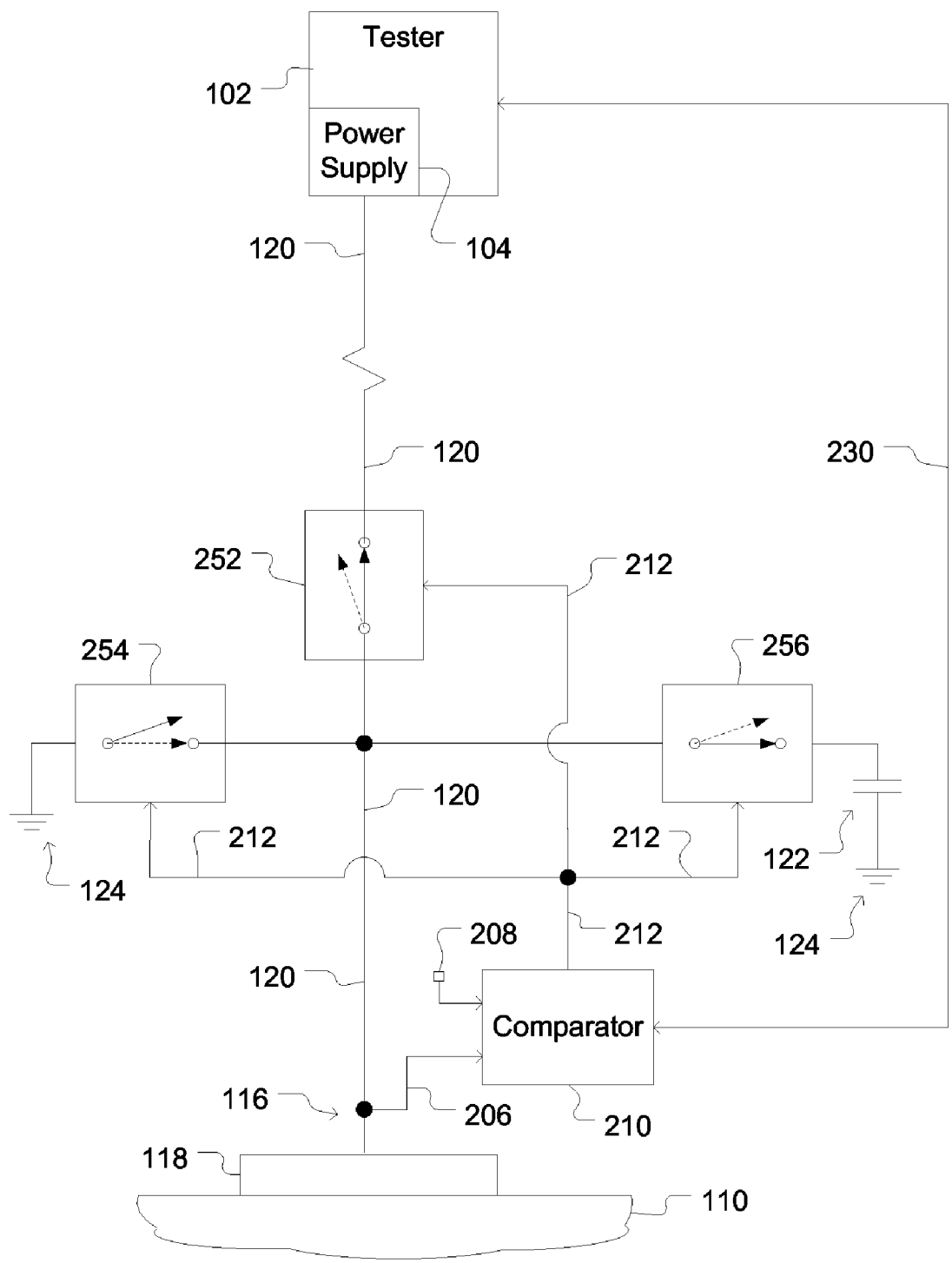

VOLTAGE FAULT DETECTION AND PROTECTION

BACKGROUND

FIG. 1A illustrates a simplified diagram of an exemplary test system 100 for testing an electronic device 110. Tester 102 generates test data, which is written through communications link 106 to interface apparatus 108, which provides connections (not shown) to probes 112 that, as shown in FIG. 1A, contact terminals 114 of the electronic device 110 under test. Response data generated by the electronic device 110 returns to the tester 102 through probes 112, interface apparatus 108, and communication link 106. The communications link 106, interface apparatus 108, and probes 112 thus provide a plurality of communications channels between the tester 102 and the electronic device 110 under test. Of course, other devices may be included in the system 100. For example, devices for processing and/or routing test data and response data may be placed between the communications link 106 and the interface apparatus 108.

The interface apparatus 108 can be a probe card apparatus, for contacting an electronic device 110 under test. Typically, power must be supplied to the electronic device 110. As shown in FIG. 1A, the power supply 104 is part of the tester 102, and power from the power supply 104 is supplied through one of the communications channels formed by the communications link 106, interface apparatus 108, and power probe 116 to the power terminal 118 of the electronic device 110.

FIG. 1B illustrates a schematic diagram of a single power line 120 from the power supply 104 to the power terminal 118 of the electronic device 110 being tested. Power line 120 represents one communications channel from the tester 102 to the electronic device being tested 110 and thus comprises a portion of the communications link 106, the interface apparatus 108, and the power probe 116. As shown in FIG. 1B, a by-pass capacitor 122 is often connected between the power line 120 and ground 124 to filter noise on the power line 120.

At times, the electronic device 110 being tested has a fault in which power is shorted to ground in the electronic device 110. Such a condition typically causes a large current surge from the power supply 104. Even if power supply 104 can include over-current protection that automatically shuts power supply 104 off upon detection of such a fault, the over-current protection circuitry (not shown) in the power supply 104 may be unable to turn the power supply 104 off due to both the delay and inductance of the power line 120 before a current surge travels down power line 120. If sufficiently large, such a current surge can damage the interface apparatus 108 or a power probe 116. In fact, probe 116 may be particularly susceptible to such damage. Moreover, even if the over-current protection circuitry (not shown) in power supply 104 is able to shut the power supply 104 off in time to prevent a current surge, by-pass capacitor 122 is likely to discharge rapidly, and the resulting current through power probe 116 may damage the probe 116.

SUMMARY

In exemplary embodiments, a comparing circuit (e.g., a comparator or a detector) can be connected to the power line supplying power to an electronic device being tested. The comparing circuit can be configured to detect a fault in which the power line can be shorted to ground. For example, the electronic device being tested may have a fault in which its power terminals are shorted to ground. Upon detection of such a fault, the comparing circuit can activate one or more switches that shunt to ground or disconnect capacitors or other energy storage devices from probes contacting the electronic device being tested. The comparing circuit may alternatively or in addition activate one or more switches that disconnect the power supply supplying power to the electronic device from probes contacting the electronic device.

BRIEF DESCRIPTION OF THE DRAWINGS

FIG. 2 illustrates a schematic diagram of a power line and by-pass capacitor that can include an exemplary fault detection and protection circuit according to some embodiments of the invention.

DETAILED DESCRIPTION OF EXEMPLARY EMBODIMENTS

Figure 1A:
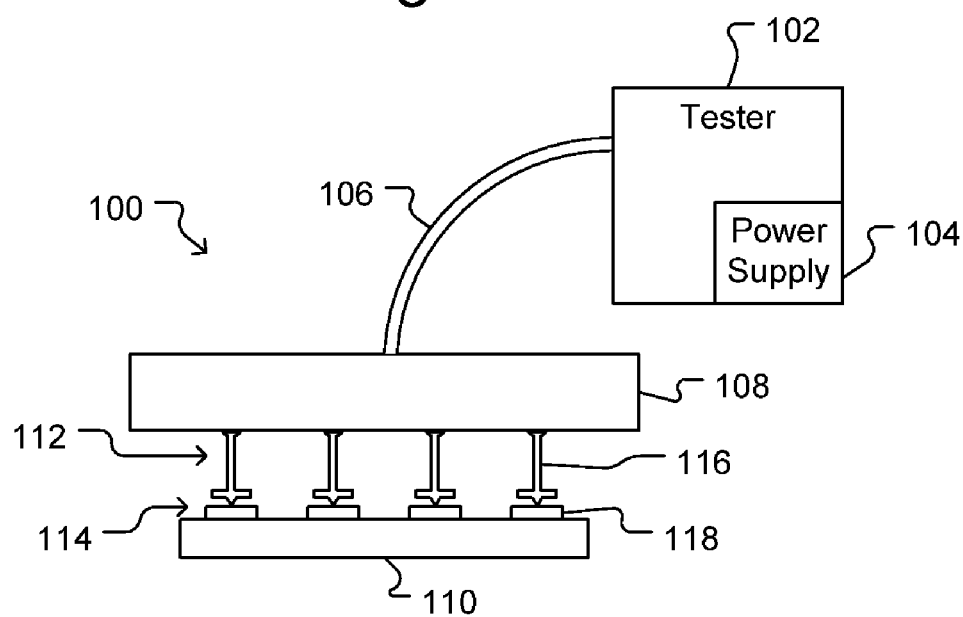
FIG. 1A illustrates a simplified diagram of an exemplary prior art test system.
Figure 1B:
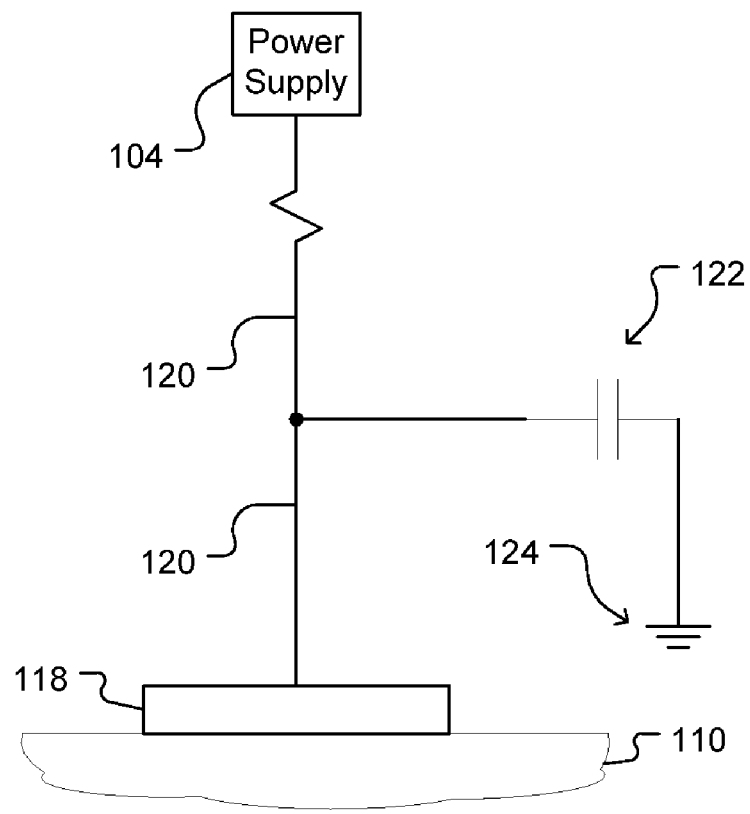
FIG. 1B is a schematic diagram of a power line and by-pass capacitor in the system of FIG. 1A.

This specification describes exemplary embodiments and applications of the invention. The invention, however, is not limited to these exemplary embodiments and applications or to the manner in which the exemplary embodiments and applications operate or are described herein.

FIG. 2 illustrates a schematic diagram of a power line 120 and by-pass capacitor 122 that can include an exemplary fault detection and protection circuit according to some embodiments of the invention. As described above, power line 120 can be a power line from the power supply 104 of a tester 102 to a power terminal 118 of an electronic device 110 (shown in partial view only) being tested. As also described above, by-pass capacitor 122 can be connected between power line 120 and ground 124 and may function as a noise filter for power line 120.

The exemplary fault detection and isolation circuit shown in FIG. 2 can include a comparator 210 and three switches 252, 254, 256. To test electronic device 110, switch 252 can be closed, and power line 120 consequently can be connected and provide power to from power supply 104 to power terminal 118 of the electronic device 110 being tested. Switch 256 can be closed, connecting by-pass capacitor 122 to power line 120. Switch 254 can be left open.

Comparator 210 can include two inputs 206, 208. One input 206 can be connected to the power line 120, preferably close to the probe 116 (which can be at the end of the power line 120) as shown in FIG. 2. The other input 208 can be connected to a reference voltage (not shown). If a fault on the electronic device 110 shorts power terminal 118 to ground, the voltage on the power line 120 will drop towards ground because of the fault. The reference voltage applied to input 208 can be set to correspond to a low voltage that represents such a fault in which power terminal 118 is shorted to ground. The reference voltage applied to input 208 can be selected in a variety of ways. For example, electronic device 110 may be designed to operate with a supplied power that is within a specified voltage range. The reference voltage applied to input 208 can be selected to be below the minimum specified operating voltage (i.e., the lower end of the specified power supply voltage) of electronic device 110. For example, an electronic device 110 may be designed to operate with a supplied power in the range of approximately 3.5-5.0 volts. Assuming that such an electronic device is supplied with a ground of zero volts, reference voltage applied to input 208 can be selected to be below 3.5 volts, for example, 3.0 volts. Higher or lower voltages can alternatively be selected as the reference voltage applied to input 208 of comparator 210.

The foregoing numerical examples are not limiting, and the reference voltage applied to input 208 can depend on the particular operating parameters of electronic device 110. The reference voltage applied to input 208 can thus be selected to be any voltage that, given the particular operating parameters of electronic device 110, indicates a fault at a power terminal of electronic device 110. Generally speaking, the closer the reference voltage is to the operating range of the electronic device 110, the faster comparator 210 can detect a fault.

If the voltage from power line 120 at input 206 of the comparator 210 drops to the reference voltage applied to input 208, the comparator 210 indicates such and the output 212 of comparator 210 can be used to open switches 252, 256 and closes switch 254. Opening switch 252 disconnects probe 116 from power supply 104, protecting probe 116 from a power surge from power supply 104 down power line 120 caused by the fault at power terminal 118. Opening switch 256 disconnects probe 116 from by-pass capacitor 122, protecting probe 116 from a sudden discharge from by-pass capacitor 122 caused by the fault. Closing switch 254 creates a path to ground 124. Thus, should a power surge from power supply 104 propagate past switch 252 before switch 252 can be opened, the closing of switch 254 provides a path to ground 124 for the power surge. The power surge can thus flow through switch 254 to ground 124, protecting probe 116. A power surge from power supply 104 can propagate past switch 252 if, for example, the sum of the propagation delay along power line 120 from probe 116 to power supply 104 plus the propagation delay from power supply 104 to switch 252 is less than the sum of the following delays: any propagation delay along input 206 between power line 120 and comparator 210, the processing delay of comparator 210, any propagation delay along output 212 between comparator 210 and switch 252, and the switching delay of switch 252.

The closing of switch 254 similarly creates a path to ground 124 for a discharge from by-pass capacitor 122 that propagates past switch 256 before switch 256 is opened. The discharge will thus flow through switch 254 to ground rather than through probe 116.

Figure 3:
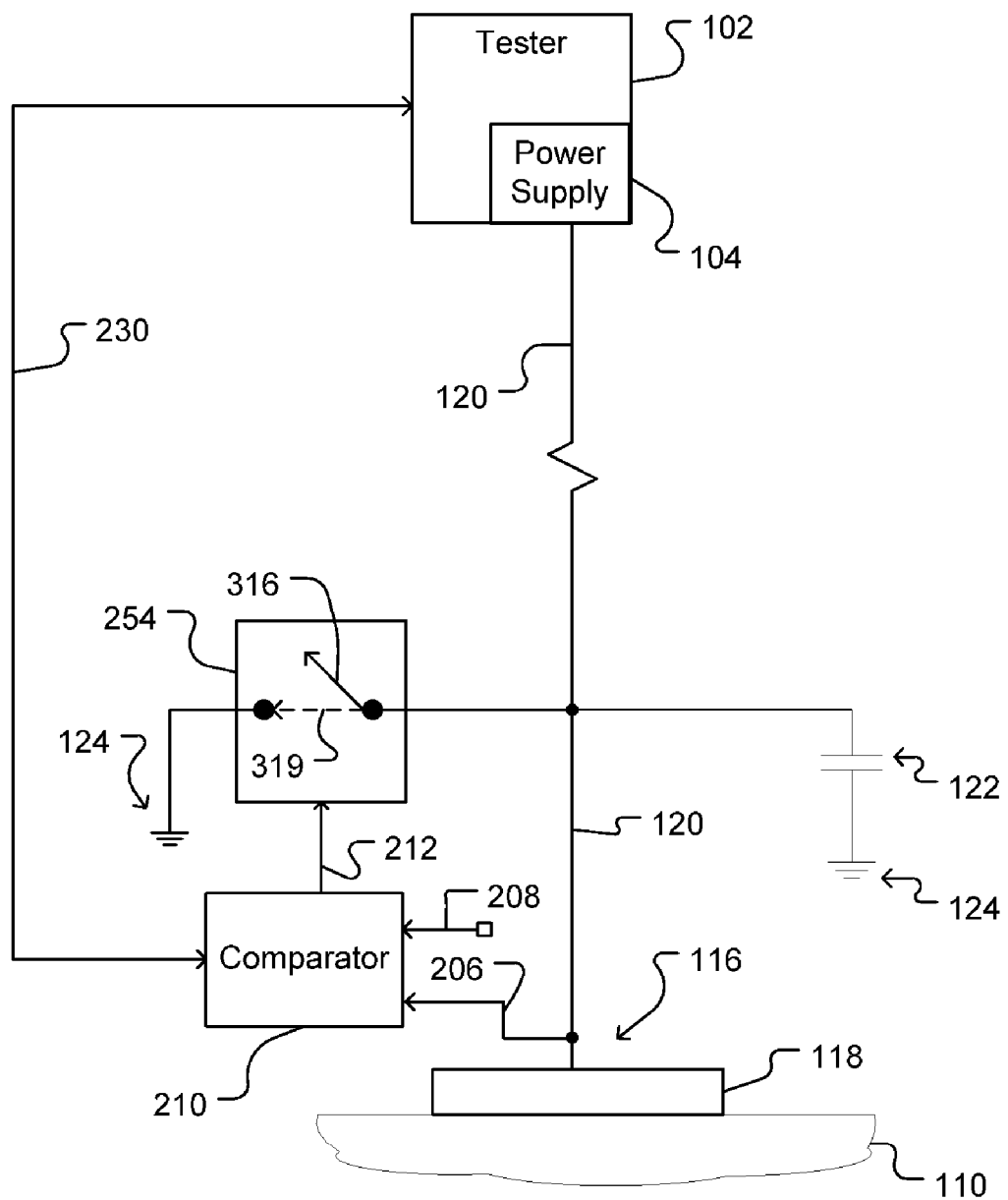
FIG. 3 shows a schematic diagram of the power line and by-pass capacitor of FIG. 2 that can include another exemplary fault detection and protection circuit according to some embodiments of the invention.

The comparator 210 and switches 252, 254, 256 can thus form and function as a fault detection and protection circuit that protects probe 116 from a power surge from power supply 104 and/or a current discharge from by-pass capacitor 122 such as may occur due to a fault in which power terminal 118 is shorted to ground. According to other embodiments, the fault detection and protection circuit shown in FIG. 2 need not include each of switches 252, 254, 256. Rather, the fault detection and protection circuit shown in FIG. 2 can include only one of switches 252, 254, 256 or any combination of two of those switches. FIG. 3 shows one non-limiting example in which the fault detection and protection circuit can include switch 254 but not switches 252, 256.

In FIG. 3, the fault detection and protection circuit can include comparator 210 and switch 254. As discussed above, while testing the electronic device 110, switch 254 can be open (i.e., in position 316). As also discussed above, if the comparator 210 detects a voltage on power line 120 indicating a fault in which power terminal 118 is shorted to ground as compared to a chosen voltage reference applied to input 208, comparator 210 can activate switch 254, causing switch 254 to move to closed position 319, which creates a path through switch 254 to ground 124. This creates a path to ground between power supply 104 and probe 116 and between by-pass capacitor 122 and probe 116. A power surge from power supply 104 and a discharge from by-pass capacitor 122 can thus flow through switch 254 to ground 124, protecting probe 116.

As shown in FIGS. 2 and 3, connection 230 may be provided between the tester 102 and the comparator 210. Such connection 230 may allow the tester to set and reset the comparator 210. Various data (e.g., status data and/or hand-shaking data) may also be exchanged between the comparator 210 and the tester 102 over connection 230. For example, the comparator 210 may send information regarding a detected fault to tester 102 through connection 230. Such information provided from comparator 210 through connection 230 to tester 102 can include a signal or signals that cause tester 102 to turn power supply 104 off. For example, upon detecting a fault, comparator 210 can (in addition to generating output signal 212 that opens switches 256, opens switch 252, and/or closes switch 254) generate a control signal or signals that are sent to tester 102 via connection 230 indicating detection of the fault and causing tester 102 to turn power supply 104 off.

Figure 4:
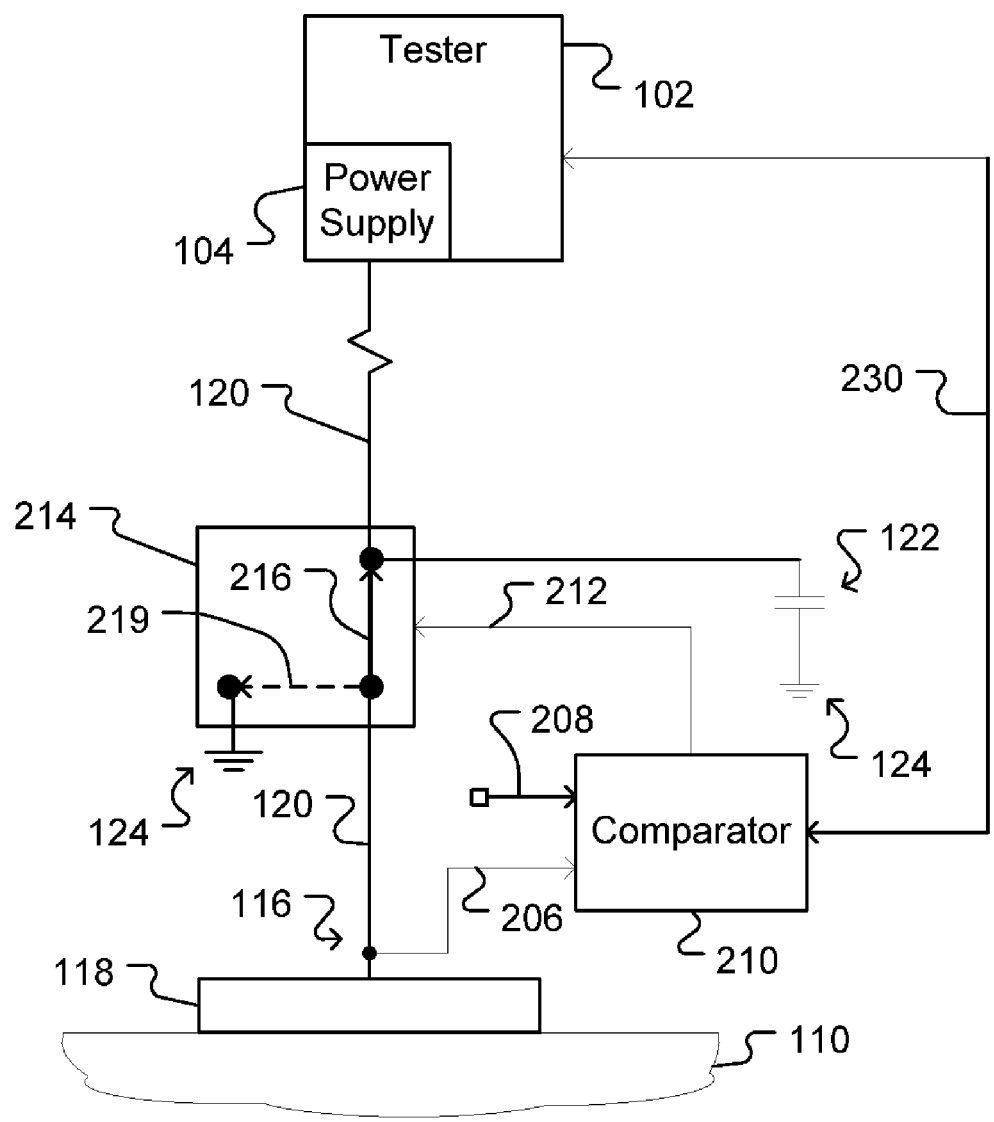
FIG. 4 illustrates a schematic diagram of the power line and by-pass capacitor of FIG. 2 with yet another exemplary fault detection and protection circuit according to some embodiments of the invention.

FIG. 4 illustrates yet another configuration of a fault detection and protection circuit according to some embodiments of the invention. FIG. 4 includes a schematic diagram of power line 120 with a fault detection and protection circuit that can include comparator 210, which can be connected to switch 214. In position 216, which can be the normal operating position of switch 214 during testing of the electronic device 110, power from power supply 104 can be connected to the power probe 116. In position 219, which can be the position of switch 214 upon detection of a fault, the probe 116 can be connected to ground 124 and disconnected from the by-pass capacitor 122. Accordingly, the charge from by-pass capacitor is generally prevented from discharging into probe 116. The probe 116 can be also disconnected from the power supply 104. The comparator 210 and switch 214 can thus form a fault detection and protection circuit that protects probe 116 from a current discharge from by-pass capacitor 122 such as may occur due to a fault in which power terminal 118 is shorted to ground. The probe 116 can be also disconnected (and thus protected) from the power supply 104.

Figure 5:
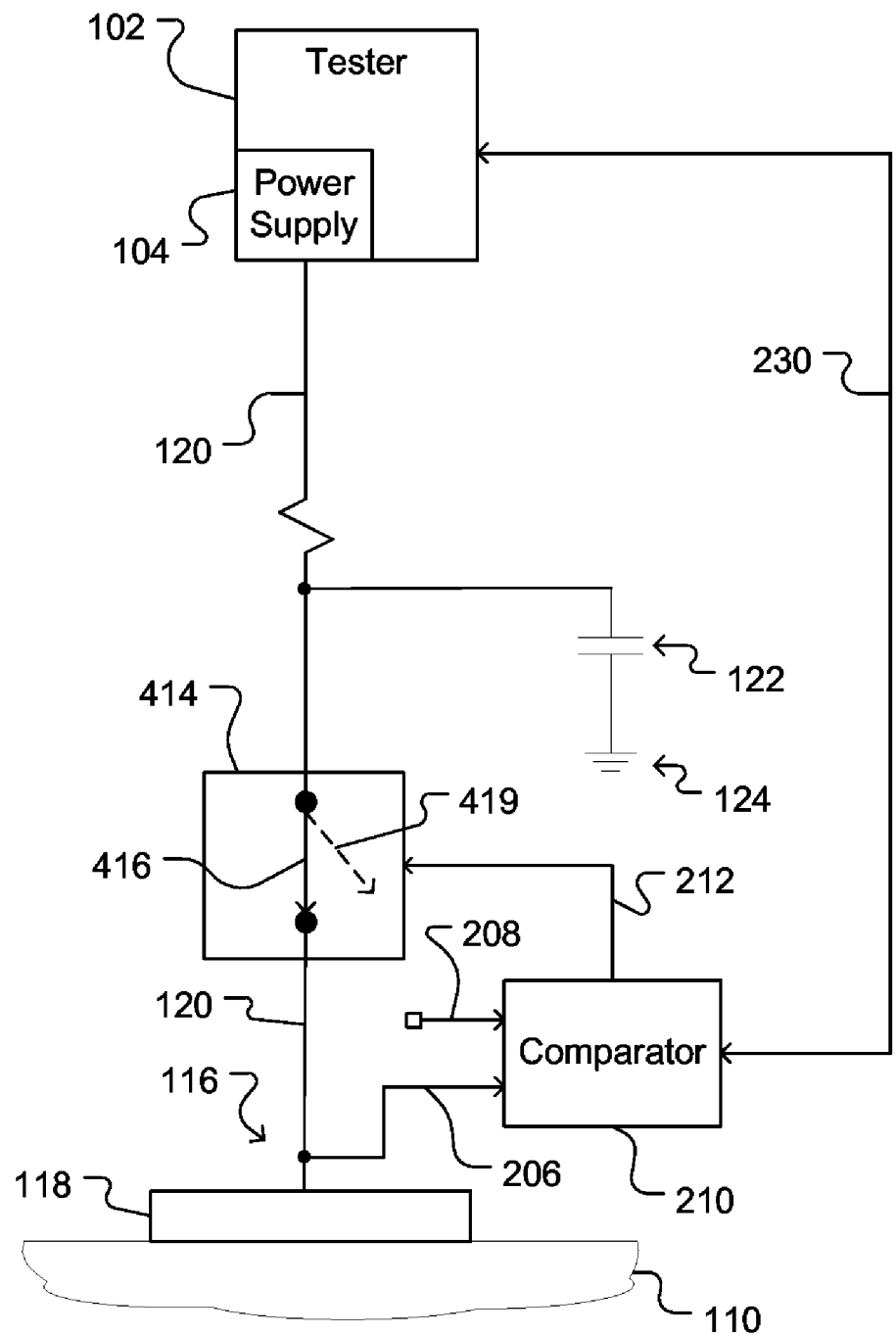
FIG. 5 illustrates a schematic diagram of the power line and by-pass capacitor of FIG. 2 with still another exemplary fault detection and protection circuit according to some embodiments of the invention.

FIG. 5 illustrates still another configuration of a fault detection and protection circuit according to some embodiments of the invention. FIG. 5 includes a schematic diagram of power line 120 with a fault detection and protection circuit that can include comparator 210, which can be connected to switch 414. While testing the electronic device 110, switch 414 can be in position 416 and forms part of power line 120. When activated by output 212 of comparator 210 (as described above), switch 414 moves to position 419, which interrupts power line 120 and disconnects probe 116 from the power supply 104. As can be seen in FIG. 5, while in position 419, switch 414 also disconnects by-pass capacitor 122 from probe 116, preventing by-pass capacitor 122 from discharging through probe 116.

In any of the foregoing embodiments, the comparator 210 can be a high speed voltage comparator (e.g., generating an output within about 100 to 1000 picoseconds or even less than 100 picoseconds of a change at its inputs), such as are known in the art. The comparator 210 may alternatively be a programmed microcontroller or other logic hardware and/or software (including without limitation firmware or microcode). Various types of monitoring and reporting may thus be programmed into comparator 210. The switches 214, 252, 254, 256, 314, 414 may be implemented using transistors (e.g., bi-polar transistors or field effect transistors), silicon controlled rectifiers, or any other structure suitable for opening and/or closing an electrically conductive line. For example, many transistors configured in parallel may form a switch 214, 252, 254, 256, 314, 414. Switches 214, 252, 254, 256, 314, 414 may alternatively be relays or any other suitable electronic switching device. Comparator 210 and/or switches 214, 252, 254, 256, 314, 414 may be implemented on an integrated circuit.

Figure 6:
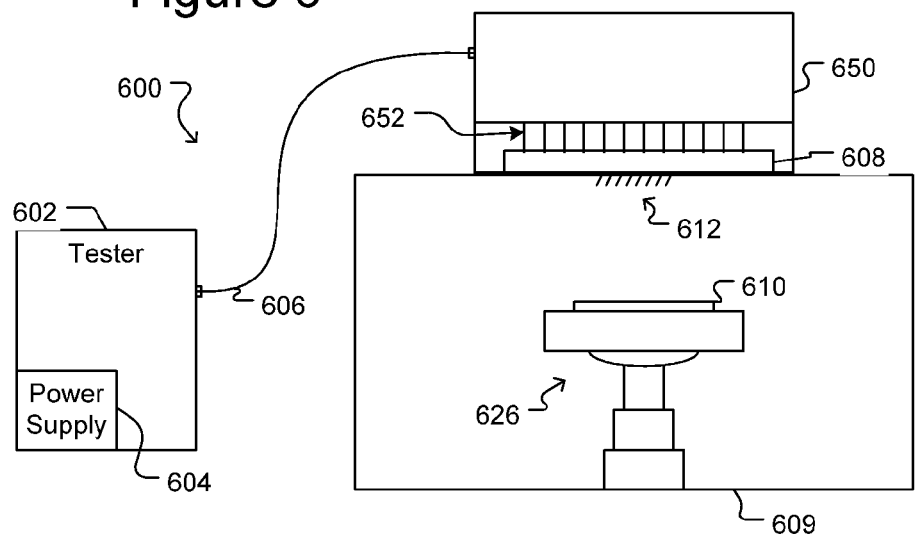
FIG. 6 illustrates an exemplary semiconductor wafer probing system according to some embodiments of the invention.

FIG. 6 illustrates an exemplary probing system 600 for testing one or more electronic devices 610, which may be, for example, one or more dies of a semiconductor wafer, one or more singulated semiconductor dies of an array of dies, or any other electronic device or devices. As will be seen, the exemplary fault detection and protection circuits of FIGS. 2-5 may be implemented on the probe card assembly 608 of the probing system 600.

As shown, the probing system 600 can include a tester 602, which may be generally similar to tester 102 of FIG. 1A, and a prober 609 with a moveable stage 626 for supporting electronic device or devices 610 under test and for moving the electronic device or devices 610 into contact with probes 612 of the probe card assembly 608. A communications link 606, test head 650, connectors 652, and probe card assembly 608 (which can include probes 612) can provide a plurality of communications channels (not shown) between the tester 602 and the semiconductor electronic device or devices 610 under test. One or more of those communications channels (not shown) may provide power from power supply 604 to the dies (not shown) of the electronic device or devices 610 under test.

The communications link 606 can provide a plurality of separate communications connections (not shown) between the tester 602 and the test head 650. Communications link 606 may be any means for communicating data and/or power. (In some embodiments, power may be supplied through electrical connections other than communications link 606.) Non-limiting examples include a cable, optical data links, wireless data links, etc. The test head 650 can route the communications connections of link 606 to the connectors 652, which in turn can provide electrically conductive paths between the test head 650 and the probe card assembly 608. Connectors 652 may be any means for providing electrically conductive paths between the test head 650 and the probe card assembly 608. Non-limiting examples include pogo pins, cables or wires with zero-insertion-force connectors, etc. The probe card assembly 608 provides electrical paths (not shown in FIG. 6) between the connectors 652 and the probes 612.

Figure 7:
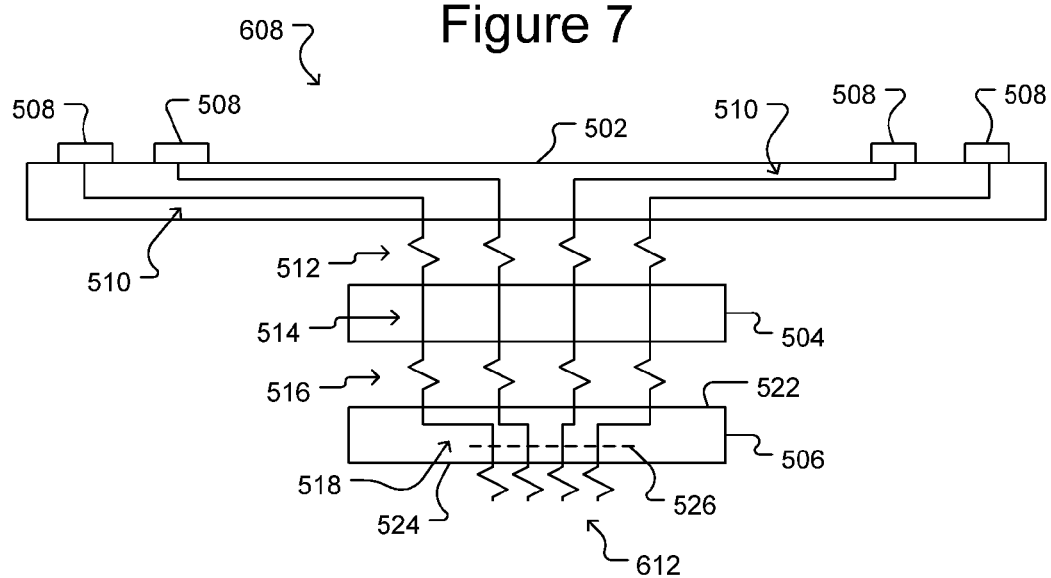
FIG. 7 illustrates an exemplary probe card assembly according to some embodiments of the invention.

Probe card assembly 608 can be any type of apparatus having probes for contacting dies (not shown) of a semiconductor electronic device or devices 610. FIG. 7 shows a simplified block and schematic diagram of one exemplary probe card assembly 608.

The probe card assembly 608 of FIG. 7 can include three substrates: a printed circuit board 502, an interposer 504, and a probe head 506. Terminals 508 electrically connect to connectors 652 of FIG. 6. Terminals 508 may be pads for receiving pogo pins (if connectors 652 are pogo pins), zero-insertion-force connectors, or any other connection device suitable for receiving connectors 652 of FIG. 6.

Electrical connections 510 (e.g., conductive vias and/or traces) through the printed circuit board 502, spring contacts 512 electrically connecting printed circuit board 502 and interposer 504, electrical connections 514 (e.g., conductive vias and/or traces) through interposer 504, spring contacts 516 electrically connecting interposer 504 and probe head 506, and electrical connections 518 (e.g., conductive vias and/or traces) through probe head 506 can electrically connect connectors 508 to probes 612. Probes 612 can be configured to contact terminals on the semiconductor dies (not shown) of electronic device or devices 610. Connectors 508, connections 510, spring contacts 512, connections 514, spring contacts 516, connections 518, and probes 612 can thus form the electrical paths between connectors 652 of FIG. 6 and the probes 612 of the probe card assembly 608 that contact the electronic device or devices 610 under test.

The probe head 506 and interposer 504 may be secured to the printed circuit board 502 using any suitable means (not shown), including without limitation bolts, screws, clamps, brackets, spring devices, etc. U.S. Pat. No. 5,974,622, U.S. Pat. No. 6,509,751, and U.S. patent application Ser. No. 11/165,833 (filed Jun. 24, 2005) describe exemplary probe card apparatuses, and various features of the probe card apparatuses described in those patents may be implemented in probe card assembly 608.

The communications link 606, test head 650, connectors 652, electrical paths (e.g., 510, 512, 514, 516, 518) through the probe card assembly 608, and probes 612 can form the plurality of communications channels mentioned above between the tester 602 and the dies (not shown) of the electronic device or devices 610. As also mentioned above, one or more of these communications channels may be used to supply power from the power supply 604 to the dies (not shown) of the electronic device or devices 610 during testing of the dies. The power line 120 in FIGS. 2-5 may represent one such communications channel used to supply power. (Power supply 104 in FIGS. 2-5 would thus represent power supply 604 in FIG. 6, and terminal 118 in FIGS. 2-5 would represent a power input terminal to one of the dies (not shown) of the electronic device or devices 610 in FIG. 6.) The by-pass capacitor 122 of FIGS. 2-5 may be placed on any or all of the substrates 502, 504, and/or 506 of the probe card assembly 608 of FIG. 7. The comparator 210 and switches 214, 252, 254, 256, 314, 414 of FIGS. 2-5 may likewise be placed on any or all of the substrates 502, 504, and/or 506. In some embodiments, by-pass capacitors (like 122) can be advantageously placed as close as possible or practical to probes 612 and therefore may be placed on probe head 506. As is known, in some cases, the closer a by-pass capacitor (e.g., like by-pass capacitor 122) is to a power input (e.g., power terminal 118) of an electronic device (e.g., electronic device 110), the more effective the capacitor can be in filtering noise on the power line out of the power signal provided to the power input. By-pass capacitors (like 122) may be placed on either side of the probe head 506, including the side 524 to which the probes 612 are attached. The comparator 210 and switches 214, 252, 254, 256, 314, 414 of FIGS. 2-5 may likewise by placed on the probe head 506 (on either side, including side 524). Input 206 of the comparator 210 may be connected to connections 518 embedded within 526 the probe head 506. The comparator 210 and switches 214, 252, 254, 256, 314, 414 may also be placed on one or more of the printed circuit board 502 and/or interposer 504.

Figure 8:
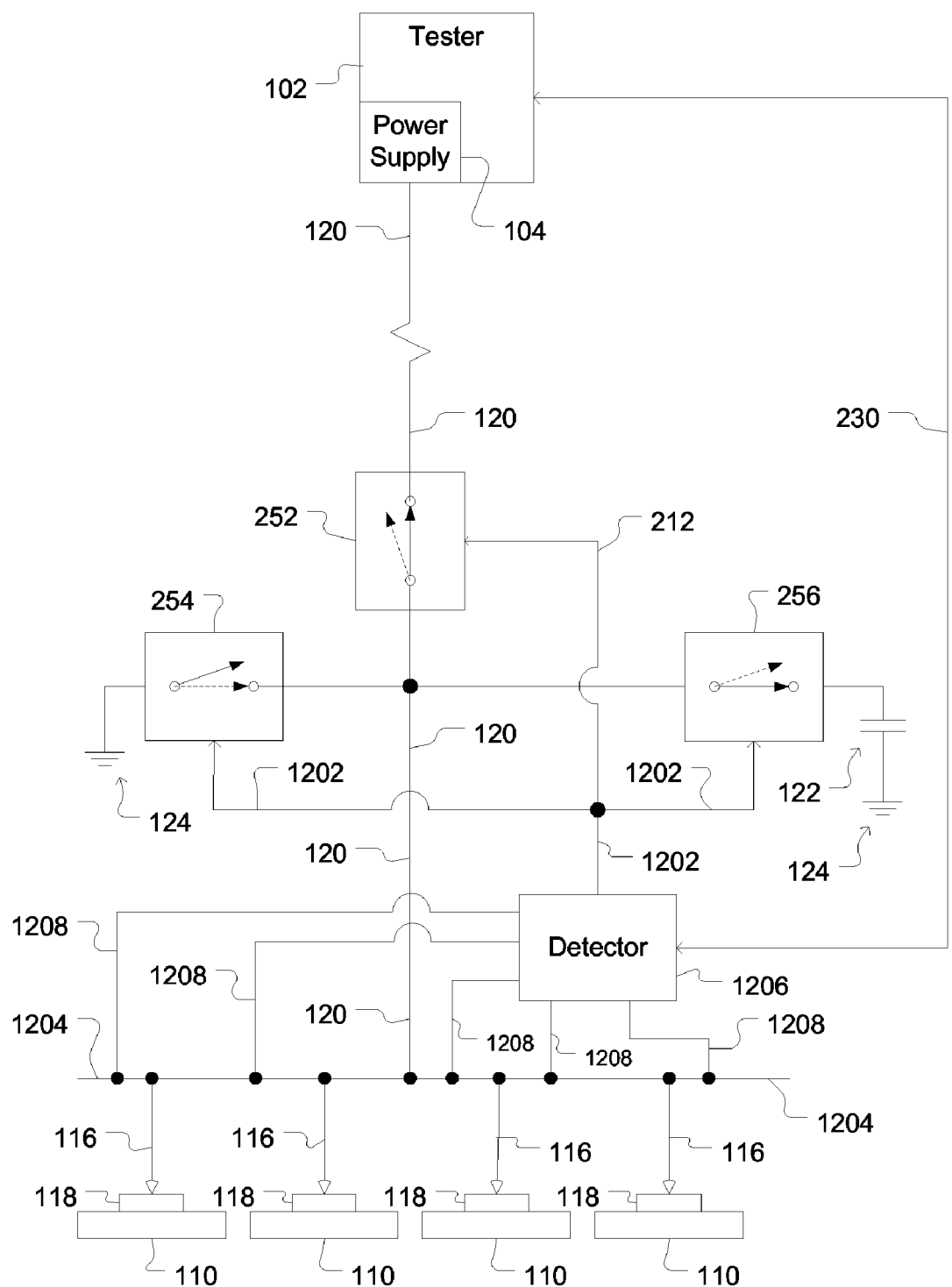
FIG. 8 illustrates yet another exemplary fault detection and protection circuit according to some embodiments of the invention.

FIG. 8 illustrates yet another configuration of a fault detection and protection circuit according to some embodiments of the invention. As shown, like the configuration of FIG. 2, the fault detection and protection circuit of FIG. 8 can include a power line 120 for supplying power from a power supply 104. A by-pass capacitor 122 can be connected to ground 124. The fault detection and protection circuit of FIG. 8 can also include switches 252, 254, and 256, which may be the same as and function as like numbered switches in FIG. 2. Unlike the fault detection and protection circuit of FIG. 2, however, the fault detection and protection circuit of FIG. 8 includes a power plane 1204 that distributes power from power line 120 through a plurality of probes 116 to a plurality of power terminals 118 of a plurality of electronic devices 110 being tested. The configuration of FIG. 8 can also include detector 1206.

As shown in FIG. 8, the inputs 1208 of detector 1206 can be electrically connected to different points on the power plane 1204. (Although five inputs 1208 can be shown in FIG. 8, more or fewer may be used.) Detector 1206 can be configured to activate output 1202 if a sufficiently large voltage difference is detected between two or more of the inputs 1208, which can be an indication that one or more of probes 116 is shorted to ground due to a short-to-ground fault at one or more of power terminals 118. As discussed above, electronic devices 110 are typically designed to operate with a supply of power within a specified voltage range. A fault in which a power terminal 118 is shorted to ground can short the probe 116 contacting the power plane 1204 to ground, which can cause a drop in the voltage on the power plane 1204 in the general vicinity where the shorted probe 116 is connected to the power plane 1204. The amount of the voltage drop can depend on the operating parameters of the electronic device 110 and the test system used to test the electronic device 110. Thus, the voltage difference detector 1206 is configured to detect can depend on the operating parameters of the electronic device 110 and test system.

Upon detecting such a difference (i.e., representing a fault at one of the power terminals 118), detector 1206 can activate output 1202, which closes switch 254 and opens switches 252 and 256 as discussed above with respect to FIG. 2. (Also as discussed above with respect to FIG. 2, the normal operating positions of switches 252, 254, 256 during testing of electronic devices 110 can be as follows: switch 252 can be closed, switch 254 can be open, and switch 256 can be closed.) As discussed above with respect to FIG. 2, closing switch 254 can provide a path to ground 124 for a current surge from power supply 104 and/or for a discharge from by-pass capacitor 122, diverting such a current surge from power supply 104 and a discharge from by-pass capacitor 122 away from probes 116. Opening switch 252 disconnects probes 116 from power supply 104, and opening switch 256 disconnects probes 116 from by-pass capacitor 122. As also discussed above with respect to FIG. 2, various configurations of the fault detection and protection circuit of FIG. 8 may be implemented with only one of or only two of switches 252, 254, 256.

Figure 9:
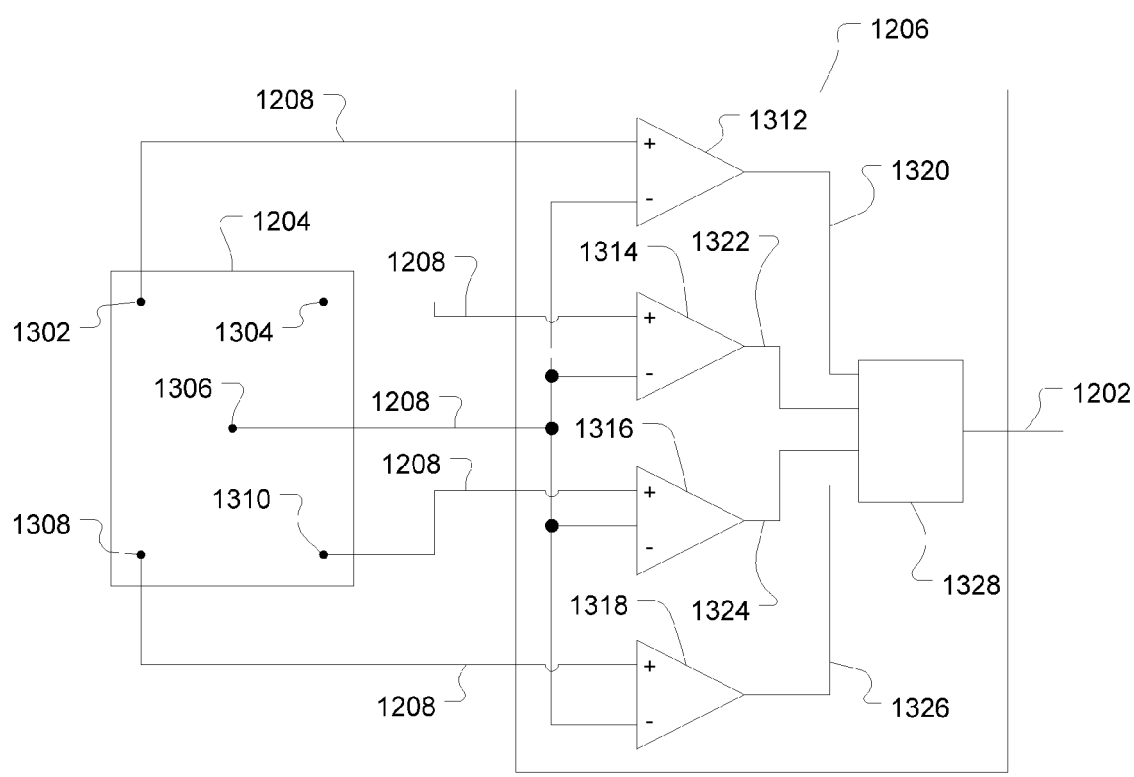
FIG. 9 illustrates an exemplary configuration of the detector of FIG. 8 according to some embodiments of the invention.

FIG. 9, which shows a top view of power plane 1204, illustrates an exemplary configuration of a detector, such as detector 1206, according to some embodiments of the invention. As shown, detector 1206 can comprise four differential amplifiers 1312, 1314, 1316, 1318 and a functional OR circuit 1328 configured to detect a positive or negative output on one or more of differential amplifier outputs 1320, 1322, 1324, 1326 active its output 1202 in response thereto. As also shown, detector 1206 can include five inputs, each tapped from five locations 1302, 1304, 1306, 1308, 1310, such as power plane 1204. One of the taps 1302, 1304, 1306, 1308, 1310 (in this example tap 1306) can be input to each of differential amplifiers 1312, 1314, 1316, 1318. Each of the other taps 1302, 1304, 1308, 1310 can become the other input to differential amplifiers 1312, 1314, 1316, 1318. Each differential amplifier 1312, 1314, 1316, 1318 can thus compare the voltage (or current) at tap 1306 to the voltage (or current) at another of taps 1302, 1304, 1308, 1310. As shown in FIG. 9, a tap (e.g., tap 1306) that is generally centrally located with respect to others of the taps (e.g., 1302, 1304, 1308, 1310) may be selected as providing a voltage to which voltages from the other taps can be compared. Alternatively, any of taps 1302, 1304, 1306, 1308, 1310 may be selected as providing a voltage to which voltages from the other taps can be compared.

The voltage (or drawn current) should be generally the same across plane 1204 unless, for example, there is a fault at one of power terminals 118 (see FIG. 8) as discussed above. Each differential amplifier 1312, 1314, 1316, 1318 can activate its output 1320, 1322, 1324, 1326 if the voltage (or drawn current) difference at its inputs exceeds a predetermined threshold, which as discussed above, indicates a fault at one or more of terminals 118. As generally discussed above, the threshold can depend on the operating parameters of electronic device 110 and the test system used to test electronic device 110. The outputs 1320, 1322, 1324, 1326 of differential amplifiers 1312, 1314, 1316, 1318 can be logically ORed together by circuit 1328 so that output 1202 of detector 1206 is activated if any of the outputs 1320, 1322, 1324, 1326 of differential amplifiers 1312, 1314, 1316, 1318 is activated.

For example, if a probe 116 connected to power plane 1204 in the vicinity of one or more of taps 1302, 1304, 1308, 1310 contacts a terminal 118 of an electronic device 110 with a short-to-ground fault, the voltage on power plane 1204 at the one or more of taps 1302, 1304, 1308, 1310 can fall below the voltage at tap 1306, and one or more of differential amplifiers 1312, 1314, 1316, 1318 can generate a positive pulse on its or their outputs 1320, 1322, 1324, 1326. If a probe 116 connected to power plane 1204 in the vicinity of tap 1306 contacts a terminal 118 of an electronic device 110 with a short-to-ground fault, the voltage on power plane 1204 at tap 1306 can fall below the voltage on power plane 1204 at taps 1302, 1304, 1308, 1310, and each of differential amplifiers 1312, 1314, 1316, 1318 can generate a negative pulse on outputs 1320, 1322, 1324, 1326. Although five taps 1302, 1304, 1306, 1308, 1310, four differential amplifiers 1312, 1314, 1316, 1318, and one OR gate 1328 are shown in FIG. 9, more or fewer taps, differential amplifiers, and/or OR gates may be used. Moreover, multiple detectors 1206 configured as shown in FIG. 9 can be connected to power plane 1204.

The exemplary fault detection and protection circuit shown in FIGS. 8 and 9 may be implemented on a probe card assembly like probe card assembly 608 of FIG. 7. For example, power plane 1204 may be embedded in probe substrate 506, and probes 116 may be implemented like probes 612 of FIG. 7. Any one or more of switches 252, 254, 256, detector 1206 (including one or more of differential amplifiers 1312, 1314, 1316, 1318 and/or OR gate 1328) may be disposed on or embedded in any of printed circuit board 502, interposer 504, and/or probe substrate 506.

In any of the foregoing embodiments, the comparator 210 and differential amplifiers 1312, 1314, 1316, 1318 can be high speed voltage comparators or differential amplifiers (e.g., generating an output within about 100 to 1000 picoseconds or even less than 100 picoseconds of a change at its inputs), such as are known in the art. Comparator 210 or differential amplifiers 1312, 1314, 1316, 1318 may alternatively be a programmed microcontroller or other logic hardware and/or software (including without limitation firmware or microcode). Various monitoring and reporting may thus be programmed into comparator 210 and/or any of differential amplifiers 1312, 1314, 1316, 138. The switches 214, 252, 254, 256, 314, 414 can be implemented using transistors (e.g., bi-polar transistors or field effect transistors), silicon controlled rectifiers, or any other structure suitable for opening and/or closing an electrically conductive line. For example, many transistors configured in parallel may form a switch 214, 252, 254, 256, 314, 414. Switches 214, 252, 254, 256, 314, 414 may alternatively be relays or any other suitable electronic switching device. Comparator 210, differential amplifiers 1312, 1314, 1316, 138 and/or switches 214, 252, 254, 256, 314, 414 may be implemented on one or more integrated circuits.

As generally discussed above with respect to FIG. 2, in any of the embodiments described herein, tester 102 can provide control signals through connection 230 to comparator 210 or detector 1206 (e.g., setting parameters of comparator 210 or detector 1206, resetting comparator 210 or detector 1206, etc.) and can receive status and/or other signals from comparator 210 or detector 1206. Moreover, comparator 210 or detector 1206 can provide information to tester 102 regarding a detected fault, and such information can include a signal or signals that cause tester 102 to turn power supply 104 off. For example, upon detecting a fault, comparator 210 or detector 1206 can (in addition to generating output signal 212 or 1202 that opens or closes one or more of switches 252, 254, 256, 414) generate a control signal or signals that are sent to tester 102 via connection 230 indicating detection of the fault and causing tester 102 to turn power supply 104 off.

Various exemplary embodiments and applications of the invention have been presented and described. Many variations and modifications and alternative embodiments and applications are possible. For example, the comparator 210 and switches 214, 252, 254, 256, 314, 414 may be configured to shunt to ground or to disconnect from power line 120 energy storage devices other than capacitors 122. As another example, the fault detection and protection circuit (comprising the comparator 210 and switches 214, 252, 254, 256, 314, 414) may be implemented in a system other than the semiconductor probing system 600 shown in FIG. 6. For example, the fault detection and protection circuit of FIG. 2-5 may be implemented in another type or configuration of a probing system, or the fault detection and protection circuit may be implemented in another type of testing system, such as the more generalized test system shown in FIG. 1A. As yet another example, the power supply 104 of FIG. 1A or 604 of FIG. 6 need not be located in the tester 102, 602 but may be placed in any location.

What is claimed is:

1. An electronic apparatus comprising:
    a probe electrically connectable to power and configured to contact and provide the power to a power terminal of an electronic device;
    detecting means for detecting a short-to-ground fault at the power terminal in which the power terminal is shorted to ground;
    protecting means for protecting the probe from a power current surge caused by the short-to-ground fault detected by the detecting means by disconnecting the probe from the power such that the probe is not connected to any power source; and
    a capacitor electrically connected to a line that provides power to the probe,
    wherein the protecting means protects the power probe from a current surge from the capacitor caused by the short-to-ground fault by disconnecting the power probe from the capacitor.

2. The apparatus of claim 1 further comprising a probe card assembly comprising a plurality of probes configured to contact a plurality of terminals of the electronic device, wherein the detecting means is disposed on the probe card assembly.

3. The apparatus of claim 2, wherein the protecting means is disposed on the probe card assembly.

4. The apparatus of claim 2, wherein:
    the probe card assembly comprises a probe substrate to which the probes are attached, and
    the detecting means is disposed on the probe substrate.

5. The apparatus of claim 4, wherein the protecting means is disposed on the probe substrate.

6. The apparatus of claim 2, wherein the detecting means compares a voltage on an electrically conductive line connected to the probe to a reference voltage.

7. The apparatus of claim 6, wherein the reference voltage is selected to indicate the short-to-ground fault at the power terminal.

8. The apparatus of claim 7, wherein the detecting means detects the short-to-ground fault and the protecting means disconnects the probe from the power such that the probe is not connected to any power source in response to the voltage on the electrically conductive line being less than the reference voltage.

9. An electronic apparatus comprising:
    a probe electrically connectable to power and configured to contact a power terminal of an electronic device;
    a capacitor electrically connected to an electrically conductive line that is connected to the probe;
    a comparing circuit configured to compare a voltage on the line to a reference voltage selected to indicate a short-to-ground fault at the power terminal in which the power terminal is shorted to ground, the comparing circuit configured to output a control signal if the voltage on the line is less than the reference voltage indicating a short-to-ground fault at the power terminal; and
    a switching mechanism activated by the output of the comparing circuit and configured, in response to output by the comparing circuit of the control signal, to disconnect the probe from the capacitor and from the power such that the probe is not connected to any power source.

10. The apparatus of claim 9 further comprising a probe card assembly comprising a plurality of probes configured to contact a plurality of terminals of the electronic device, wherein the conductive line and the comparing circuit are disposed on the probe card assembly.

11. The apparatus of claim 10, wherein the switching mechanism is disposed on the probe card assembly.

12. The apparatus of claim 10, wherein:
    the probe card assembly comprises a probe substrate to which the probes are attached, and
    the comparing circuit is disposed on the probe substrate.

13. The apparatus of claim 12 wherein the switching mechanism is disposed on the probe substrate.

14. The apparatus of claim 9, wherein the switching mechanism, in response to output by the comparing circuit of the control signal, creates an open circuit on the line between the capacitor and the probe thereby disconnecting the probe from the capacitor.

15. The apparatus of claim 9, wherein the switching mechanism comprises a plurality of switches.

16. The apparatus of claim 9, wherein the reference voltage corresponds to a minimum voltage requirement for power for the electronic device.

* * * * *